(12) United States Patent
Yug et al.

(10) Patent No.: US 11,971,751 B2
(45) Date of Patent: Apr. 30, 2024

(54) DISPLAY DEVICE, METHOD FOR MANUFACTURING THE DEVICE AND LASER PROCESSING APPARATUS FOR MANUFACTURING THE DISPLAY DEVICE

(71) Applicant: Samsung Display Co. Ltd., Yongin-si (KR)

(72) Inventors: Geun Woo Yug, Seoul (KR); Ku Hyun Kang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 654 days.

(21) Appl. No.: 17/125,901

(22) Filed: Dec. 17, 2020

(65) Prior Publication Data

US 2021/0141421 A1    May 13, 2021

Related U.S. Application Data

(62) Division of application No. 16/357,351, filed on Mar. 19, 2019, now Pat. No. 10,901,463.

(30) Foreign Application Priority Data

May 29, 2018 (KR) .................. 10-2018-0061012

(51) Int. Cl.
    *G06F 1/16* (2006.01)
    *F21V 8/00* (2006.01)
    (Continued)

(52) U.S. Cl.
    CPC ......... *G06F 1/1652* (2013.01); *G02B 5/3025* (2013.01); *G02B 6/0056* (2013.01); *H10K 77/111* (2023.02)

(58) Field of Classification Search
    CPC ... G06F 1/1652; G06F 1/1626; G02B 5/3025; G02B 6/0056; G02B 27/286;
    (Continued)

(56) References Cited

U.S. PATENT DOCUMENTS 8,654,304 B2  2/2014 Lee et al.
9,446,566 B2  9/2016 Miwa et al.
(Continued)

FOREIGN PATENT DOCUMENTS

CN  101179093  5/2008
CN  106057817  10/2016
(Continued)

OTHER PUBLICATIONS

Notice of Allowance dated Sep. 14, 2020, in U.S. Appl. No. 16/357,351.
(Continued)

*Primary Examiner* — David A Vanore
(74) *Attorney, Agent, or Firm* — KILE PARK REED & HOUTTEMAN PLLC

(57) ABSTRACT

A method of manufacturing a display device, including: providing an object to be processed; forming a linear portion of the object to be processed by performing a first laser processing for the object to be processed; and forming a curved portion of the object to be processed by performing a second laser processing different from the first laser processing for the object to be processed. A laser processing apparatus, is also provided, including: an irradiation unit applying a laser onto an object to be processed; and a controller controlling an operation of the irradiation unit. The controller controls the irradiation unit to form a linear portion of the object to be processed by applying the laser onto the object according to a first condition and forming a curved portion of the object by applying the laser onto the object according to a second condition different from the first condition.

6 Claims, 12 Drawing Sheets

(51) Int. Cl.
*G02B 5/30* (2006.01)
*H10K 77/10* (2023.01)

(58) Field of Classification Search
CPC .. H10K 77/111; H10K 59/12; H10K 59/1201; H10K 50/00; H10K 71/00; Y02P 70/50; Y02E 10/549; G09F 9/30; B23K 26/38; B23K 2101/36
See application file for complete search history.

(56) References Cited

U.S. PATENT DOCUMENTS

| | | | |
|---|---|---|---|
| 9,454,033 B2 | 9/2016 | Tatemura et al. | |
| 10,359,660 B2 | 7/2019 | Sato et al. | |
| 10,520,774 B2 | 12/2019 | Go et al. | |
| 10,551,652 B2* | 2/2020 | Zhang | H10K 50/8426 |
| 10,678,098 B2 | 6/2020 | Kim et al. | |
| 11,528,813 B2* | 12/2022 | Jeong | G06F 1/1637 |
| 2006/0046512 A1* | 3/2006 | Nakamura | B23K 26/0661 |
| | | | 257/E21.414 |
| 2008/0111479 A1 | 5/2008 | Choi et al. | |
| 2009/0066242 A1* | 3/2009 | Koo | H10K 50/8426 |
| | | | 313/506 |
| 2009/0086325 A1* | 4/2009 | Liu | B23K 26/324 |
| | | | 445/25 |
| 2009/0295277 A1* | 12/2009 | Logunov | H10K 50/8426 |
| | | | 313/504 |
| 2011/0025940 A1 | 2/2011 | Liu et al. | |
| 2011/0165815 A1* | 7/2011 | Lee | H10K 50/8426 |
| | | | 445/25 |
| 2011/0194063 A1* | 8/2011 | Lee | G02F 1/1339 |
| | | | 313/504 |
| 2011/0214728 A1* | 9/2011 | Veerasamy | B82Y 10/00 |
| | | | 174/68.2 |
| 2011/0217455 A1* | 9/2011 | Veerasamy | C09D 7/70 |
| | | | 977/932 |
| 2012/0000611 A1* | 1/2012 | Lee | B23K 26/206 |
| | | | 359/200.8 |
| 2013/0095582 A1* | 4/2013 | Miyairi | H10K 71/00 |
| | | | 257/E33.001 |
| 2013/0271710 A1 | 10/2013 | Tatemura et al. | |
| 2013/0300284 A1* | 11/2013 | Nishido | H10K 50/841 |
| | | | 313/511 |
| 2013/0300966 A1* | 11/2013 | Jin | H01L 27/124 |
| | | | 438/34 |
| 2014/0138647 A1* | 5/2014 | Moon | H10K 50/8426 |
| | | | 257/40 |
| 2015/0191388 A1 | 7/2015 | Abramov et al. | |
| 2015/0236045 A1* | 8/2015 | Im | G02F 1/136286 |
| | | | 257/72 |
| 2016/0020056 A1* | 1/2016 | Kim | H01J 9/261 |
| | | | 445/25 |
| 2016/0035530 A1* | 2/2016 | Seong | B23K 26/0734 |
| | | | 445/25 |
| 2016/0111677 A1* | 4/2016 | Hong | H10K 50/8426 |
| | | | 257/40 |
| 2016/0115069 A1 | 4/2016 | Abramov et al. | |
| 2016/0121645 A1* | 5/2016 | Chen | B32B 38/0004 |
| | | | 156/247 |
| 2016/0219732 A1* | 7/2016 | Cho | G02F 1/1333 |
| 2016/0307922 A1 | 10/2016 | Kim et al. | |
| 2016/0322447 A1* | 11/2016 | Kim | G09G 3/3233 |
| 2016/0342010 A1* | 11/2016 | Kim | G02F 1/133305 |
| 2017/0050877 A1 | 2/2017 | Altman et al. | |
| 2017/0090116 A1* | 3/2017 | Lee | G02B 6/0006 |
| 2017/0184775 A1* | 6/2017 | Kang | G02B 6/0046 |
| 2017/0301843 A1* | 10/2017 | Kim | H01L 33/62 |
| 2017/0358762 A1 | 12/2017 | Min et al. | |
| 2017/0362697 A1* | 12/2017 | Richter | C23C 14/0005 |
| 2017/0365650 A1 | 12/2017 | Kwon et al. | |
| 2018/0011514 A1 | 1/2018 | Yoo et al. | |
| 2018/0102399 A1* | 4/2018 | Cho | H10K 59/131 |
| 2018/0105451 A1* | 4/2018 | Wieland | C03B 33/04 |
| 2018/0111869 A1 | 4/2018 | O'Connot et al. | |
| 2018/0143499 A1* | 5/2018 | Lim | H10K 50/8426 |
| 2018/0159087 A1 | 6/2018 | Yug | |
| 2018/0248140 A1* | 8/2018 | Sano | H10K 71/00 |
| 2018/0284529 A1* | 10/2018 | Sato | G02F 1/133512 |
| 2018/0356668 A1 | 12/2018 | Koide et al. | |
| 2018/0358567 A1 | 12/2018 | Min et al. | |
| 2019/0123117 A1 | 4/2019 | Kwon et al. | |
| 2019/0157582 A1* | 5/2019 | Yug | H10K 50/844 |
| 2019/0165309 A1 | 5/2019 | Kim et al. | |
| 2019/0181387 A1* | 6/2019 | Go | H10K 59/122 |
| 2019/0269011 A1* | 8/2019 | Lee | H05K 3/0014 |
| 2019/0294281 A1 | 9/2019 | Kim | |
| 2019/0369667 A1* | 12/2019 | Yug | G02B 6/0056 |
| 2020/0144523 A1 | 5/2020 | Min et al. | |
| 2020/0257148 A1 | 8/2020 | Kim et al. | |
| 2020/0274105 A1* | 8/2020 | Han | H10K 50/841 |
| 2020/0285095 A1* | 9/2020 | Okumura | G02F 1/133305 |
| 2020/0303664 A1* | 9/2020 | Choi | H10K 59/131 |
| 2021/0111234 A1 | 4/2021 | Kwon et al. | |
| 2021/0296601 A1 | 9/2021 | Min et al. | |

FOREIGN PATENT DOCUMENTS

| | | |
|---|---|---|
| CN | 106103367 | 11/2016 |
| CN | 106458693 | 2/2017 |
| CN | 107492556 | 12/2017 |
| CN | 107527997 | 12/2017 |
| CN | 107610593 | 1/2018 |
| CN | 107785286 | 3/2018 |
| CN | 107787260 | 3/2018 |
| JP | 2001-294437 | 10/2001 |
| JP | 2012-041196 | 3/2012 |
| JP | 2013-221959 | 10/2013 |
| KR | 2011-0092062 | 8/2011 |
| KR | 2014-0010125 | 1/2014 |
| KR | 10-2015-0045076 | 4/2015 |
| KR | 2016-0123436 | 10/2016 |
| KR | 2017-0061769 | 6/2017 |
| KR | 10-2018-0063936 | 6/2018 |

OTHER PUBLICATIONS

Corrected Notice of Allowance dated Sep. 23, 2020, in U.S. Appl. No. 16/357,351.
Office Action dated Jun. 21, 2023 from the Korean Patent Office for Korean Patent Application No. 10-2018-0061012.

* cited by examiner

DISPLAY DEVICE, METHOD FOR MANUFACTURING THE DEVICE AND LASER PROCESSING APPARATUS FOR MANUFACTURING THE DISPLAY DEVICE

CROSS-REFERENCE TO RELATED APPLICATION

This application is a Divisional of U.S. patent application Ser. No. 16/357,351, filed on Mar. 19, 2019, and claims priority from and the benefit of Korean Patent Application No. 10-2018-0061012, filed on May 29, 2018, which are hereby incorporated by reference for all purposes as if fully set forth herein.

BACKGROUND

Field

Exemplary embodiments of the invention relate generally to a display device, a method for manufacturing the display device, and a laser processing apparatus for manufacturing the display device.

Discussion of the Background

A display device used for displaying an image typically includes a display panel, such as an organic light emitting display panel or a liquid crystal display panel. With development of technology, there is an increasing demand for a display panel with a large display area and a display panel having a curved surface. However, the curved display panel may be more susceptible to impact damage as compared with a rectangular linear display panel.

Particularly, the curved display panel includes a curved portion and a linear portion according to a shape thereof, in which the linear portion generally absorbs the impact in a surface contact form at the time of external impact to disperse the impact, but the curved portion absorbs the impact in a dot contact form, and thus, may be vulnerable to the impact. Therefore, studies on a method for processing the curved portion of a curved display panel for improving the problems have been conducted.

The above information disclosed in this Background section is only for understanding of the background of the inventive concepts, and, therefore, it may contain information that does not constitute prior art.

SUMMARY

Exemplary embodiments of the present invention provide a display device which is resistant to external impact by improving an outer side shape of a curved portion.

Exemplary embodiments of the present invention also provide a method for manufacturing a display device capable of improving an outer side shape of a curved portion.

Exemplary embodiments of the present invention also provide a laser processing apparatus for manufacturing a display device capable of improving an outer side shape of a curved portion.

Additional features of the inventive concepts will be set forth in the description which follows, and in part will be apparent from the description, or may be learned by practice of the inventive concepts.

An exemplary embodiment of the present invention provides a display device including a linear portion and a curved portion, and includes a first substrate including a first surface and a second surface opposite the first surface; a second substrate including a third surface and a fourth surface opposite the third surface; and a display panel disposed between the first surface of the first substrate and the fourth surface of the second substrate. An outer surface adjacent to the first surface of the first substrate protrudes outward from an outer surface adjacent to the second surface of the first substrate, and a first width of a region of the first surface of the first substrate that does not overlap with the second surface in the linear portion is larger than a second width of a region of the first surface of the first substrate that does not overlap with the second surface of the first substrate in the curved portion.

Another exemplary embodiment of the present invention provides a method of manufacturing a display device, including: providing an object to be processed; forming a linear portion of the object to be processed by performing a first laser processing for the object to be processed; and forming a curved portion of the object to be processed by performing a second laser processing different from the first laser processing for the object to be processed.

Another exemplary embodiment of the present invention provides a laser processing apparatus, including: an irradiation unit applying a laser onto an object to be processed; and a controller controlling an operation of the irradiation unit. The controller controls the irradiation unit to form a linear portion of the object to be processed by applying the laser onto the object to be processed according to a first condition and form a curved portion of the object to be processed by applying the laser onto the object to be processed according to a second condition different from the first condition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
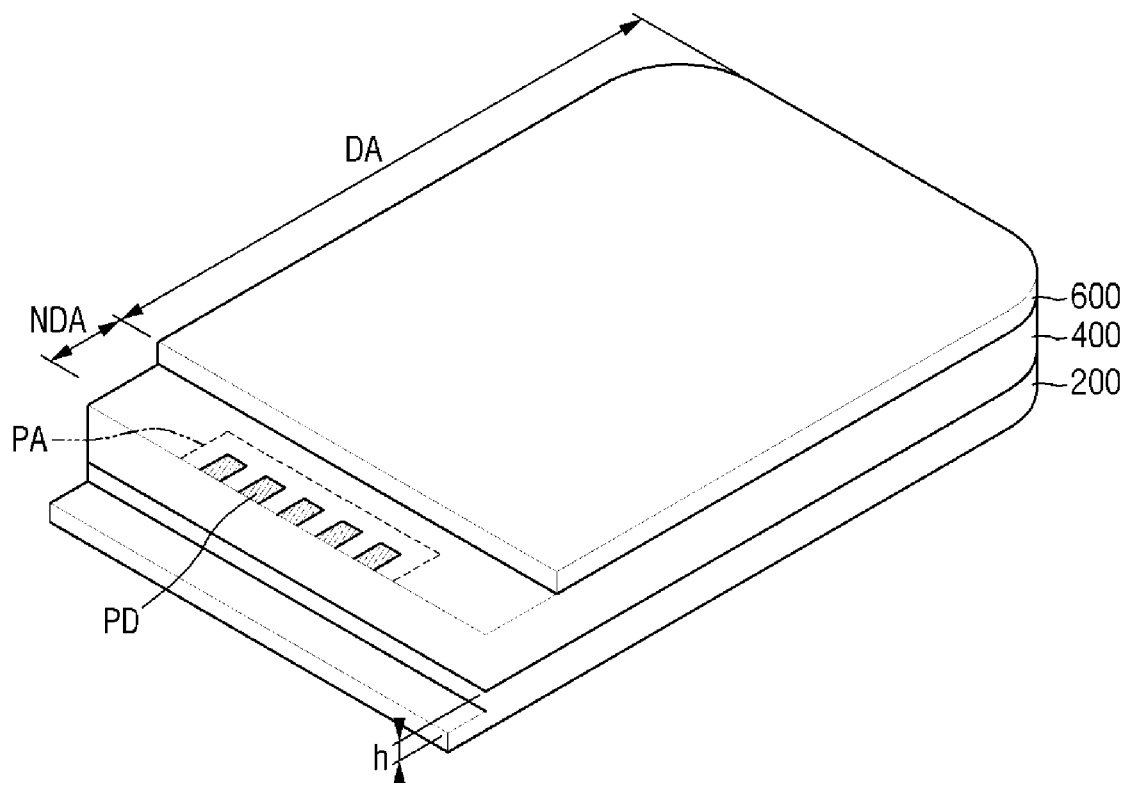
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the drawings, components may be exaggerated or reduced in size for convenience of explanation.

Throughout the specification, like reference numerals refer to like elements.

Hereinafter, exemplary embodiments of the present invention will be described in detail with reference to the accompanying drawings.

In this specification, a display device refers to a device for providing light, and for example, includes devices such as an organic light emitting display device, an inorganic light emitting display device, and a plasma display device, which display a screen using a lighting device or light.

Figure 2:
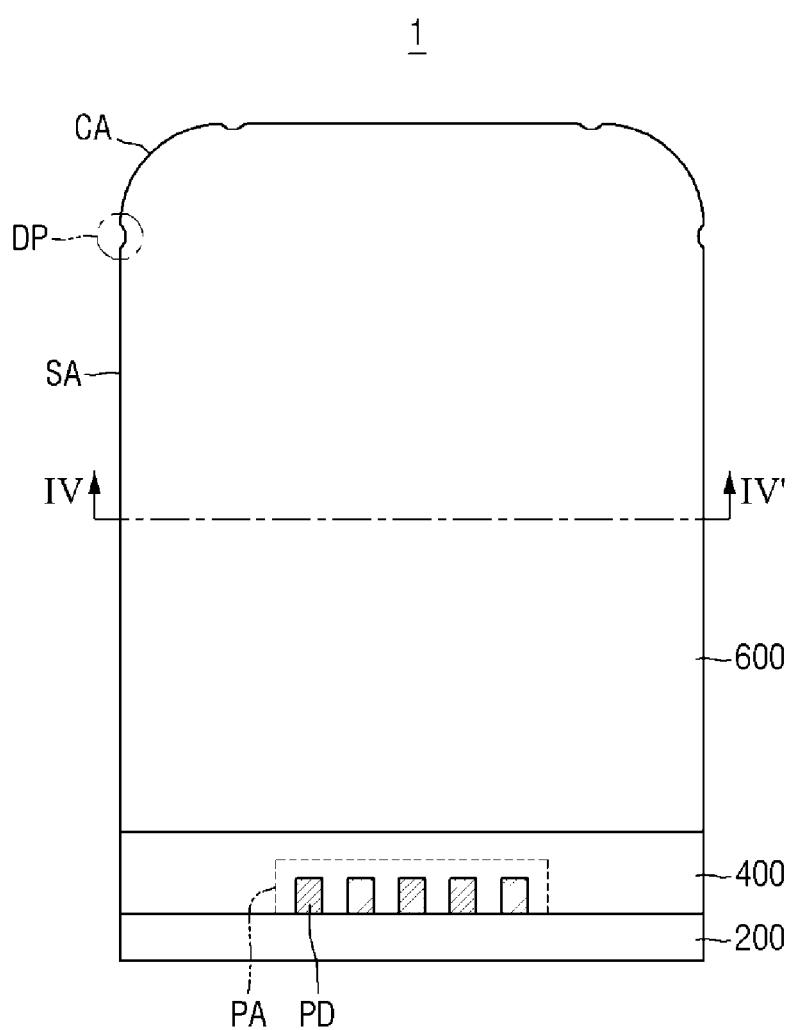
FIG. 2 is a plan view of the display device of FIG. 1.
Figure 3:
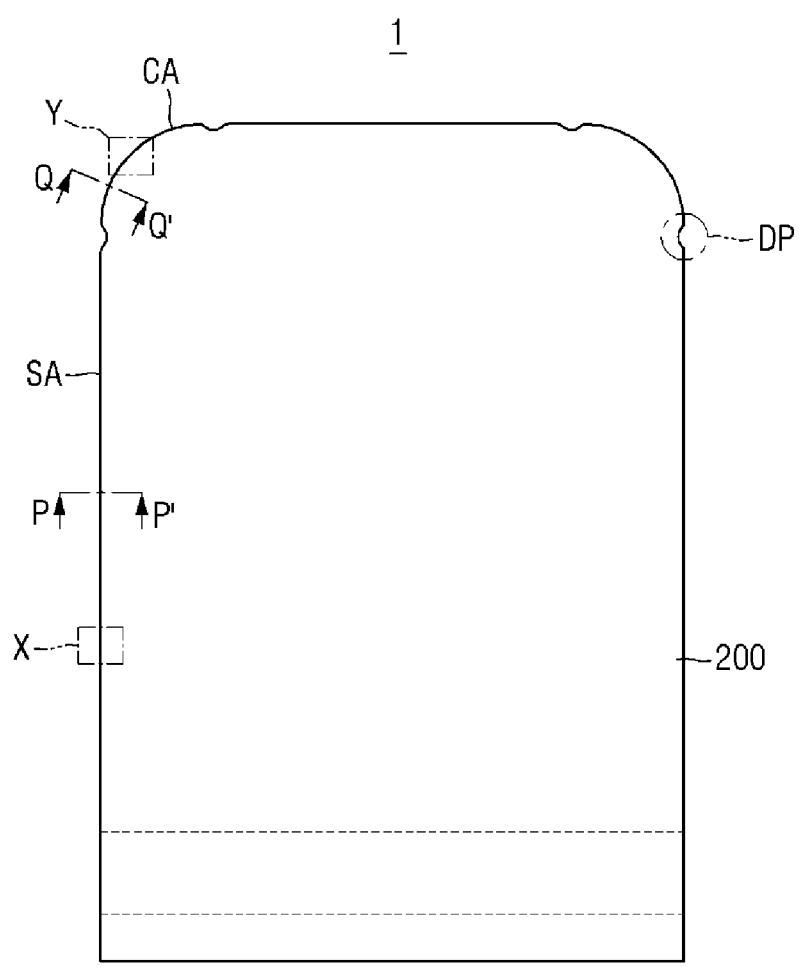
FIG. 3 is a rear view of the display device of FIG. 1.

FIG. 1 is a perspective view of a display device according to an exemplary embodiment. FIG. 2 is a plan view of the display device of FIG. 1. FIG. 3 is a rear view of the display device of FIG. 1.

Referring to FIGS. 1 to 3, a display device 1 may include a display panel 400, a first substrate 200 disposed on a lower surface 400b of the display panel 400, and a second substrate 600 provided on an upper surface 400a of the display panel 400.

The display panel 400 may have various shapes. For example, the display panel 400 may be formed in a shape including a linear portion SA and a curved portion CA, as shown in FIGS. 1 to 3. Specifically, when the display panel 400 has sides formed of straight lines, at least some of the edges having an angular shape may be curved. For example, when the display panel 400 has a rectangular shape, a portion where the adjacent straight sides meet may be replaced by a curved line having a predetermined curvature. That is, vertex portions having a rectangular shape may be formed of curved sides having a predetermined curvature of which both ends adjacent to each other are connected to two straight sides adjacent to each other. Herein, the straight sides configure the linear portion SA and curved lines having a predetermined curvature may configure a curved portion CA.

The curvature of the curved portion CA may be set differently depending on the position. For example, the curvature may be changed depending on a position at which the curved line starts and a length of the curve line.

The display panel 400 may display an image. The display panel 400 may be a self-emissive display panel such as, for example, an organic light emitting display panel (OLED panel), but is not limited thereto. In various exemplary embodiments, as the display panel 400, non-emissive display panels such as a liquid crystal display panel (LCD panel), an electro-phoretic display panel (EPD panel), and an electro-wetting display panel (EWD panel) may be used. When the non-emissive display panel is used as the display panel 400, the display device 1 may further include a back-light unit for providing light to the display panel 400. Hereinafter, an example in which the OLED panel is used as the display panel 400 will be described.

The display panel 400 may include a display area DA and a non-display area NDA. The display area DA is an area for displaying an image or a video, and may include a plurality of pixels. Each pixel may be any one of a red pixel, a green pixel, a blue pixel, and a white pixel, but is not limited thereto.

For example, the pixel may be any one of a magenta pixel, a cyan pixel, and a yellow pixel. The pixels may have a display element OLED. Such a display element OLED may be an organic light emitting element.

The non-display area NDA may be adjacent to display area DA. For example, the non-display area NDA may be disposed to surround the display area DA. A pad portion PA may be disposed at one side of non-display area NDA. The pad portion PA may include a plurality of pads PD. The pads PD may be a kind of input/output terminal for electrically connecting the display panel 400 to other electronic devices, for example, a flexible printed circuit board (FPCB).

The first substrate 200 may be disposed below the display panel 400. The first substrate 200 may have a different size from the display panel 400. For example, the length of the first substrate 200 may be greater than the length of the display panel 400.

The first substrate 200 may include a first area and a second area. The first area is an area overlapping with the display panel 400 and the second area may be located at one side of the first area and not overlap with the display panel 400. The second area may have an area smaller than that of the first area.

The thickness of the first substrate 200 in the first area and the thickness of the first substrate 200 in the second area may be different from each other. That is, a stepped portion having a predetermined height h may exist between the first area and the second area. The height h of the stepped portion may be smaller than the thickness of the display panel 400.

Although not shown in detail, the display panel 400 and the first substrate 200 may be attached to each other by an adhesive layer. Such an adhesive layer may include a silicon adhesive as a transparent adhesive material having a high light transmittance and may include an acrylic adhesive, a pressure sensitive adhesive (PSA), an optically clear adhesive (OCA), an optically clear resin (OCR), and the like.

The second substrate 600 may be disposed above the display panel 400. The second substrate 600 may have a different size from the display panel 400. For example, the length of the second substrate 600 may be smaller than the length of the display panel 400.

The second substrate 600 may be disposed on the display area DA of the display panel 400. Since the length of the second substrate 600 is smaller than the length of the display panel 400, some of the lines or pads PD formed in the non-display area NDA may be exposed to the outside of the second substrate 600.

Although not shown in detail, the display panel 400 and the second substrate 600 may be attached to each other by an adhesive layer. Such an adhesive layer may include an acrylic adhesive as a transparent adhesive material having a high light transmittance or may also include a silicon adhesive, a pressure sensitive adhesive (PSA), an optically clear adhesive (OCA), an optically clear resin (OCR), and the like.

In an exemplary embodiment, the display device 1 may include a deformed portion DP formed at a point where the linear portion SA and the curved portion CA meet. Specifically, the deformed portion DP may be formed on the outer surface where the linear portion SA and the curved portion CA are in contact with each other.

The deformed portion DP may be formed in such a manner that a processing condition for processing the linear portion SA and that a processing condition for processing the curved portion CA are different from each other when the display device 1 is manufactured according to some exemplary embodiments. Although the deformed portion DP is largely emphasized for ease of understanding in the drawing, the actual size of the deformed portion DP may be very small such that the deformed portion DP cannot be visually confirmed. In some exemplary embodiments, the shape of the deformed portion DP may include a depression formed in the surface of the outer surface, as shown in the drawings.

Figure 4:
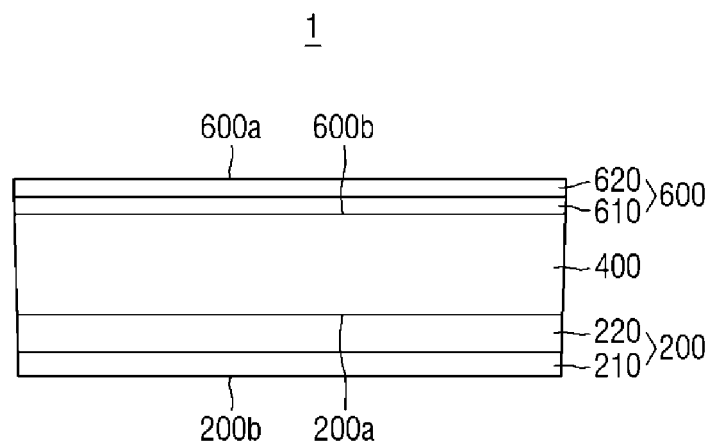
FIG. 4 is a cross-sectional view taken along line IV-IV' of FIG. 2.
Figure 5:
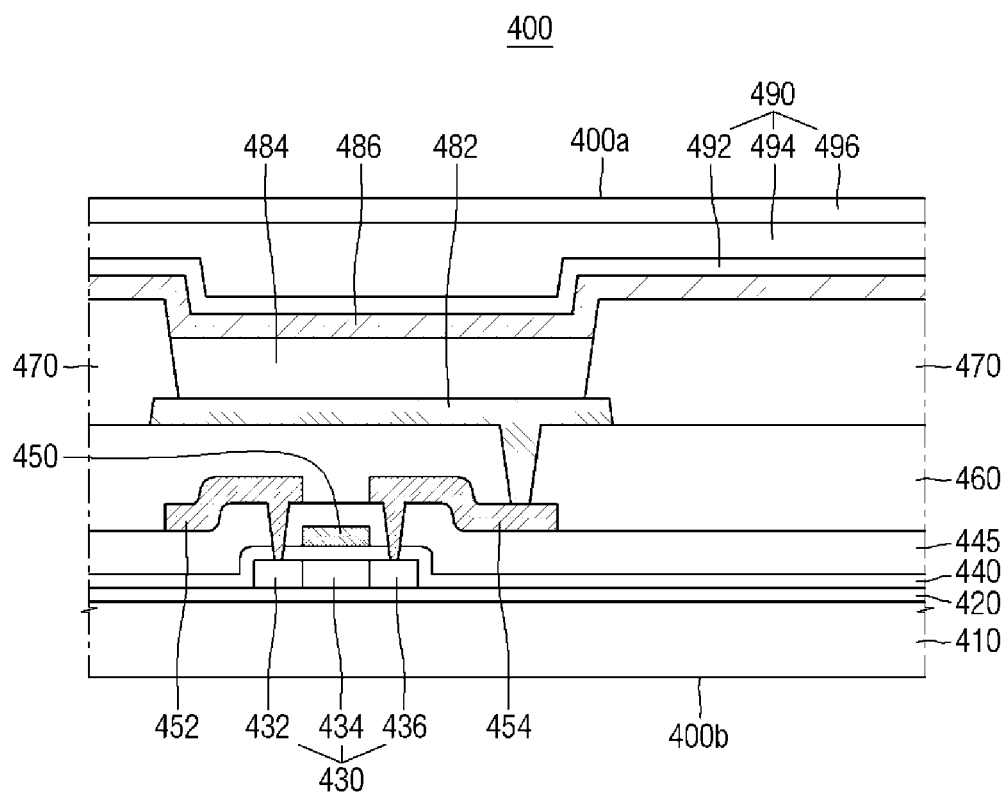
FIG. 5 is a detailed cross-sectional view of the display panel of FIG. 4.

FIG. 4 is a cross-sectional view taken along line IV-IV' of FIG. 2. FIG. 5 is a detailed cross-sectional view of the display panel of FIG. 4.

Referring to FIGS. 4 and 5, the first substrate 200 may include the lower surface 200b and the upper surface 200a. The display panel 400 may be disposed on the upper surface 200a of the first substrate 200. The second substrate 600 may include a lower surface 600b and an upper surface 600a. The display panel 400 may be disposed on the lower surface 600b of the second substrate 600. In other words, the display panel 400 may be disposed between the upper surface 200a of the first substrate 200 and the lower surface 600b of the second substrate 600.

The widths of the first substrate 200, the display panel 400, and the second substrate 600 may be decreased in the order of the second substrate 600, the display panel 400, and the first substrate 200, as shown in the drawings. The reason why the shapes of the first substrate 200, the display panel 400, and the second substrate 600 are the same as described above is that laser light is incident on the lower surface 200b of the first substrate 200 to manufacture the display device 1. Accordingly, when the laser light is incident to the upper surface 600a of the second substrate 600, the widths of the first substrate 200, the display panel 400 and the second substrate 600 may be different from those shown in the drawings.

Although the widths of the first substrate 200, the display panel 400, and the second substrate 600 are somewhat exaggerated in the drawings so as to show a large difference for a relative comparison, the widths thereof may have a minute difference which cannot be visually distinguished.

The first substrate 200 may include, for example, a support substrate. Specifically, the first substrate 200 may include, for example, a flexible film. More specifically, the first substrate 200 may include a carrier film 210 and a protection and bending film 220.

The first substrate 200 supports the display panel 400 when the display panel 400 bending to prevent the display panel 400 from being damaged. The first substrate 200 may include at least one of polyethylene terephthalate (PET), polyethylene naphthalate (PEN), polypropylene (PP), polycarbonate (PC), polystyrene (PS), polysulfone (PS), polyethylene (PE), polyphthalamide (PPA), polyethersulfone (PES), polyarylate (PAR), and modified polyphenylene oxide (MPPO).

The display panel 400 may include a plurality of pixel areas including driving transistors 430 and 450 and organic light emitting elements 482, 484, and 486. The organic light emitting elements 482, 484, and 486 may be deposited at a relatively low temperature, have low power consumption, and implement high luminance to be applied to a flexible display device such as a foldable display device and a rollerable display device.

The pixel area refers to a basic unit for displaying an image, and the display panel 400 may display an image by a plurality of pixel areas. In some exemplary embodiments, the pixel area may be defined by a pixel defining film 470 to be described below.

Although only the driving transistors 430 and 450 are shown in FIG. 5, at least one selection transistor for driving the organic light emitting elements 482, 484, and 486, at least one capacitor, and at least one of driving transistors 430 and 450 may be arranged in each pixel area.

A substrate 410 may be made of a flexible material. An example of such a flexible material may be a plastic material. Specifically, the substrate 410 may be formed of any one selected from the group consisting of kapton, polyethersulfone, polycarbonate, polyimide, polyethylene terephthalate (PET), polyethylene naphthalate (PEN), polyacrylate (PAR), fiber reinforced plastic (FRP), and the like.

In an exemplary embodiment, the substrate 410 may have a thickness of 5 μm to 200 μm. The thickness of the substrate 410 is maintained at 200 μm or less to maintain a flexible characteristic of the substrate 410, and the thickness of the substrate 410 is maintained at 5 μm or more to secure stability capable of stably supporting the organic light emitting elements 482, 484, and 486.

A buffer layer 420 may be disposed on the substrate 410. The buffer layer 420 may serve to prevent impure elements from being penetrated and planarize the surface thereof. The buffer layer 420 may be made of any one of, for example, a silicon nitride ($SiN_x$) film, a silicon oxide ($SiO_2$) film, a silicon oxynitride ($SiO_xN_y$) film, or the like. However, such a buffer layer 420 is not necessarily required, and may also be omitted according to a type of substrate 410 and device manufacturing process conditions.

A semiconductor layer 430 may be disposed on the buffer layer 420. The semiconductor layer 430 may include any one of a polycrystalline silicon film (poly Si), an amorphous silicon film (amorphous Si), and an oxide semiconductor, such as indium-gallium-zinc oxide (IGZO) and indium zinc tin oxide (IZTO). For example, when the semiconductor layer 430 includes the polycrystalline silicon film, the semiconductor layer 430 may include a channel region 434 in which impurities are not doped, and a source region 432 and a drain region 436 which are formed on both sides of the channel region by doping impurities.

The types of impurities doped into the source region 432 and the drain region 436 may vary depending on the types of the driving transistors 430 and 450. In some embodiments, P-type transistors doped with P-type impurities may be used in the source region 430 and the drain region 432 as the driving transistors 430 and 450, but the inventive concepts are not limited thereto.

A gate insulating film 440 may be disposed between the semiconductor layer 430 and the gate electrode 450. The gate insulating film 440 may include an insulating film. For example, the gate insulating film 440 may include at least one of silicon nitride ($SiN_x$) and silicon oxide ($SiO_2$). In an exemplary embodiment, the gate insulating film 440 may also be formed of a multilayer structure including a double-layer film instead of a single film.

The gate electrode 450 may be disposed on the gate insulating film 440. The gate electrode may extend in one direction to be connected to a gate line. The gate electrode 450 may be disposed so as to overlap with the channel region 434. The gate electrode 450 may include at least one of, for example, molybdenum (Mo), chromium (Cr), tungsten (W), titanium (Ti), and copper (Cu). In addition, although not shown in detail, a first electrode of the capacitor may be disposed on the gate insulating film 440.

An interlayer insulating film 445 may be disposed on the gate electrode 450. The interlayer insulating film 445 may be disposed so as to completely cover the gate electrode 450. The interlayer insulating film 445 may include silicon nitride ($SiN_x$), silicon oxide ($SiO_x$), tetraethoxysilane (TEOS) or the like, similarly to the gate insulating film 440, but the inventive concepts are not limited thereto.

A data line including the source electrode 452 and the drain electrode 454 may be disposed on the interlayer insulating film 445. Although not shown in detail, a second electrode of the capacitor may also be disposed on the interlayer insulating film 445. In an exemplary embodiment, the source electrode 452 and the drain electrode 454 may also be formed in the form of a multilayer film having a double film or more, and in this case, the interlayer insulating film 445 may be disposed between the multilayers.

The source electrode 452 and the drain electrode 454 may be connected to the source region 432 and the drain region 436 through via holes formed in the gate insulating film 445 and the interlayer insulating film 545, respectively. At this time, as shown in the drawing, vias are formed in the via holes so that the source electrode 452 and the drain electrode 454 may be connected to the source region 432 and the drain region 436, respectively.

The drain electrode 454 may be connected to a pixel electrode 482 of the organic light emitting elements 482, 484, and 486 through a via formed in a planarization layer 460.

The driving transistors 430 and 450 may provide a driving signal to the pixel electrode 482 to emit light of the light emitting layer 484 of the organic light emitting elements 482, 484, and 486 in the selected pixel area.

Specifically, a voltage corresponding to a difference between a data voltage supplied from the data line and a common voltage supplied from a common power supply line is stored in the capacitor, and a driving current corresponding to the voltage stored in the capacitor runs to the organic light emitting elements 482, 484, and 486 through the driving transistors 430 and 450 to emit light in the organic light emitting elements 482, 484, and 486.

The planarization film 460 may be disposed on the interlayer insulating film 445 so as to cover the source electrode 452 and the drain electrode 454. The planarization film 460 may serve to remove and planarize a step in order to increase emission efficiency of the organic light emitting elements 482, 484, and 486 to be disposed thereon. The planarization film 460 may include at least one material of, for example, a polyacrylate-based resin, an epoxy resin, a phenolic resin, a polyamide-based resin, a polyimide-based resin, an unsaturated polyester-based resin, a polyphenylenether-based resin, a polyphenylenesulfide-based resin, and benzocyclobutene (BCB).

The pixel electrode 482 of the organic light emitting elements 482, 484, and 486 may be disposed on the planarization film 460. The pixel electrode 482 may be electrically connected to the drain electrode 454 through a via formed in the planarization film 460.

The pixel defining film 470 may be disposed to expose a part of the pixel electrode 482. The pixel defining film 470 may define a pixel area of the display area DA (see FIG. 1) and the pixel electrode 482 may be disposed to correspond to the pixel area by the pixel defining film 470.

The pixel defining film 470 may include a resin such as a polyacrylate-based resin or polyimides.

The light emitting layer 484 may be disposed on the pixel electrode 482 in the pixel area and a common electrode 486 may be disposed on the pixel defining film 470 and the light emitting layer 484. The light emitting layer 484 may be formed of a low molecular organic material or a high molecular organic material. Although not shown in detail, the light emitting layer 484 may include a hole injection layer (HIL) and a hole transporting layer (HTL) which are disposed adjacent to the pixel electrode 482. Further, the light emitting layer 484 may include an electron transporting layer (ETL) and an electron injection layer (EIL) disposed adjacent to the common electrode 486.

In an exemplary embodiment, the pixel electrode 482 and the common electrode 486 may be formed as a transmissive electrode or a transflective electrode. Accordingly, the light generated in the light emitting layer 484 may be provided to the outside through the upper surface 400a and the lower surface 400b of the display panel 400.

In an exemplary embodiment, the pixel electrode 482 may be formed as a reflective electrode and the common electrode 486 may be formed as a transmissive electrode or a transflective electrode. Accordingly, the light generated in the light emitting layer 484 may be provided in a direction of the upper surface 400a of the display panel 400.

For example, a transparent conductive oxide (TCO) may be used for forming a transmissive electrode. Examples of the transparent conductive oxide (TCO) may include indium tin oxide (ITO), fluorine doped tin oxide (FTO), indium zinc oxide (IZO), zinc oxide (ZnO), aluminum doped ZnO (AZO), gallium doped ZnO (GZO), boron doped ZnO (BZO), indium oxide ($In_2O_3$), or the like. In addition, metal nanowires and carbon nanomaterials may be used. For example, silver nanowires (Ag—NW), carbon nanotubes, carbon nanowires, fullerene, graphene, and the like may be used.

For forming the transflective electrode, a metal such as magnesium (Mg), silver (Ag), gold (Au), calcium (Ca), lithium (Li), chromium (Cr), aluminum (Al), and copper (Cu) or alloys thereof may be used. At this time, the pixel electrode 482 and the common electrode 486 may be formed as the transflective electrodes by controlling the thickness of the electrode. As the thickness of the transflective electrode becomes smaller, the transmittance of light increases, but the resistance increases. In addition, the greater the thickness, the lower the transmittance of light.

Further, the transflective electrode may be formed as a multilayer structure including a metal layer made of a metal or a metal alloy and a transparent conductive oxide (TCO) layer laminated on the metal layer.

A thin film encapsulation layer 490 may be disposed on the common electrode 486. The thin film encapsulation layer 490 may include inorganic films 492 and 496 and an organic film 494. In an exemplary embodiment, the thin film encapsulation layer 490 may be disposed in a form in which the inorganic films 492 and 496 and the organic film 494 are alternately laminated. Further, the inorganic films 492 and 496 and the organic film 494 may also laminated with inorganic films and organic films more than those shown in the drawing.

A lower inorganic film 492 may be disposed nearest to the organic light emitting elements 482, 484, and 486.

The lower inorganic film 492 may include at least one inorganic material of $Al_2O_3$, $TiO_2$, ZrO, $SiO_2$, AlON, AlN, SiON, $Si_3N_4$, ZnO, and $Ta_2O_5$. The lower inorganic film 492 may be formed by a method such as a chemical vapor deposition (CVD) method or an atomic layer deposition (ALD) method. Accordingly, the lower inorganic film 492 may be conformally disposed according to the shape of the common electrode 486 as shown in the drawing. The upper inorganic film 496 may include the same material as the lower inorganic film 492.

The organic layer 494 may include a polymer-based material. Here, the polymer-based material may include an acrylic resin, an epoxy resin, polyimide, polyethylene, and the like. The organic film 494 may be formed through a thermal deposition process. At this time, the thermal deposition process for forming the organic film 494 may be performed within a temperature range without damaging the organic light emitting elements 482, 484, and 486.

The inorganic films 492 and 486, in which the thin film is formed to have a high density, may serve to mainly suppress the permeation of moisture or oxygen.

The thin film encapsulation layer 490 may be formed to, for example, a thickness of 10 μm or less. Accordingly, the overall thickness of the display panel 400 may be made very small. As such, the thin film encapsulation layer 490 is applied to maximize a flexible characteristic of the display panel 400.

The second substrate 600 may include, for example, an optical substrate. In particular, the second substrate 600 may include, for example, a polarization plate.

The second substrate 600 may include a linear polarization layer 620 and a phase difference layer 610. The phase difference layer 610 may be disposed between the thin film encapsulation layer 490 and the linear polarization layer 620.

The linear polarization layer 620 may transform natural light or any polarization light into linear polarization light in a specific direction, and may reduce reflection of external light. A polarization axis of the phase difference layer 610 may be inclined at an angle of 45° with respect to a polarization axis of the phase difference layer 610.

The phase difference layer 610 may shift phase of the light incident on the phase difference layer 610 by ¼ λ. That is, since the phase difference layer 610 shifts the phase of the incident light by ¼ λ, it is possible to convert linear polarization light into circular polarization light or circular polarization light into linear polarization light.

The second substrate 600 may prevent reflection of external light as follows. First, external light can pass through the linear polarization layer 620. Here, the light passing through the linear polarization layer 620 may be linear polarization light having only a component perpendicular to the polarization axis of the linear polarization layer 620.

The light passing through the linear polarization layer 620 may pass through the phase difference layer 610. The light passing through the phase difference layer 610 may be circular polarization light in which the phase is shift by ¼ λ by the phase difference layer 610.

The light passing through the phase difference layer 610 may be reflected on the display panel 400. The light reflected on the display panel 400 (hereinafter referred to as "reflected light") may maintain a circularly polarized state. This reflected light may pass through the phase difference layer 610 again. In the reflected light passing through the phase difference layer 610, the phase may be shift by ¼ λ by the phase difference layer 610. The reflected light reflected on the display panel 400 may be linear polarization light. Here, the reflected light passing through the phase difference layer 610 may be parallel to the polarization axis of the linear polarization layer 620. Accordingly, the reflected light passing through the phase difference layer 610 may not pass through the linear polarization layer 620, but may be absorbed by the linear polarization layer 620. Accordingly, the second substrate 600 may prevent external light incident to the display device 1 from being reflected. As such, when the reflection of external light is prevented by the second substrate 600, the contrast of the display device 1 may be improved.

Figure 6A:
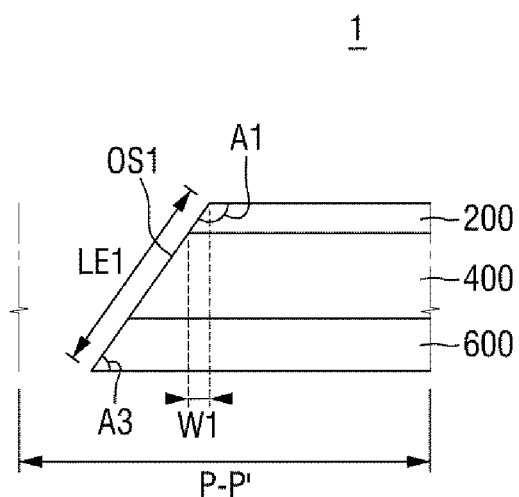
FIG. 6A and FIG. 6B are cross-sectional views taken along the lines P-P' and Q-Q', respectively, of FIG. 3.
Figure 6B:
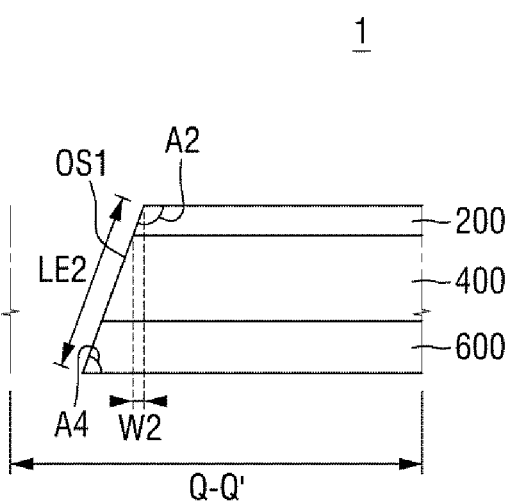
Figure 7:
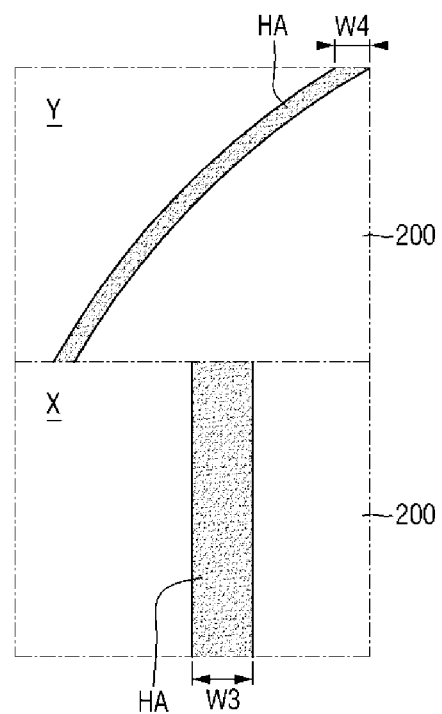
FIG. 7 is an enlarged view of a region X and a region Y of the display device of FIG. 3.

FIGS. 6A and 6B are cross-sectional views taken along the lines P-P' and Q-Q', respectively, of FIG. 3 and FIG. 7 is an enlarged view of a region X and a region Y of the display device of FIG. 3.

Referring to FIGS. 6A and 6B, an outer surface OS1 (see a cut section of P-P') of the linear portion SA of the display device 1 may be different from an outer surface OS1 (see a cut section of Q-Q') of the curved portion CA. Specifically, the slope of the outer surface OS1 of the curved portion CA may be greater than the slope of the outer surface OS1 of the linear portion SA. According to the shape of the outer surface OS1, an edge portion of the outer surface OS1 of the curved portion CA of the display device 1 (for example, a portion where the outer surface is adjacent to the upper surface of the second substrate 600) may be not sharp but blunt instead. This shape of the outer surface OS1 of the curved portion CA allows the curved portion CA to withstand the external impact better. Thus, the reliability of the display device 1 may be improved.

Specifically, in the both the linear portion SA and the curved portion CA, the outer surface OS1 of the display panel 400 may protrude outward from the outer surface of the first substrate 200 and the outer surface OS1 of the second substrate 600 may protrude outward from the outer surface of the display panel 400. At this time, the degree of protrusion of the outer surface of the linear portion SA may be greater than the protrusion degree of the outer surface of the curved portion CA.

More specifically, a width W1 of a region of the upper surface 200a (see FIG. 4) of the first substrate 200 which does not overlap with the lower surface 200b (see FIG. 4) in the linear portion SA may be larger than a width W2 of a region of the upper surface 200a (see FIG. 4) of the first substrate 200 that does not overlap with the lower surface 200b (see FIG. 4) in the curved portion CA.

Such a shape shown in the drawing may be caused because the laser light is incident from the first substrate 200 to the second substrate 600 to cut the display device 1. If the laser light is incident from the second substrate 600 to the first substrate 200 to cut the display device 1, the shape of the outer surface OS1 may be formed differently.

Furthermore, an angle A1 between the outer surface OS1 and the lower surface of the first substrate 200 in the linear portion SA may be larger than an angle A2 between the outer surface OS1 and the lower surface of the first substrate 200 in the curved portion CA. Further, an angle A3 between the upper surface 600a (see FIG. 4) and the outer surface OS1 of the second substrate 600 in the linear portion SA may be smaller than an angle A4 between the upper surface 600a (see FIG. 4) and the outer surface OS1 of the second substrate 600 in the curved portion CA.

In an exemplary embodiment, a length LE1 of the outer surface OS1 extending from the lower surface 200b (see FIG. 4) of the first substrate 200 to the upper surface 600a (see FIG. 4) of the second substrate 600 in the linear portion SA may be larger than a length LE2 of the outer surface OS1 extending from the lower surface 200b (see FIG. 4) of the first substrate 200 to the upper surface 600a (see FIG. 4) of the second substrate 600 in the curved portion CA.

Referring to FIG. 7, the display device 1 may include different types of heat affected zones HAs in the linear portion SA and the curved portion CA. Particularly, a width W3 of the heat affected zone HA formed to be adjacent to the outer surface of the linear portion SA may be greater than a width W4 of the heat affected zone HA formed to be adjacent to the outer surface of the curved portion CA. The shape of the heat affected zone HA may be caused because a laser processing recipe of the linear portion SA is different from a laser processing recipe of the curved portion CA. A more detailed description thereof will be given while describing a method of manufacturing a display device according to exemplary embodiments.

Figure 8A:
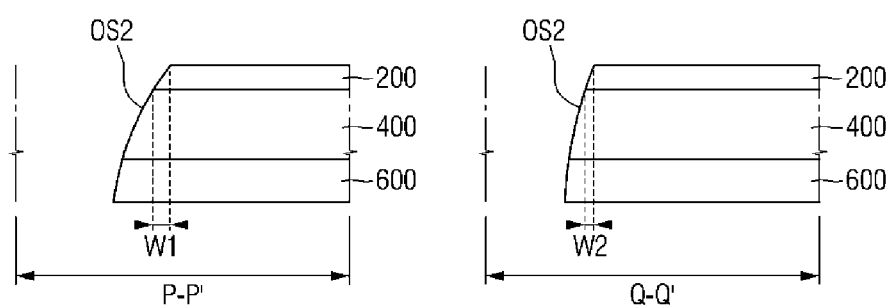
FIG. 8A and FIG. 8B are cross-sectional views of a display device according to another exemplary embodiment.
Figure 8B:
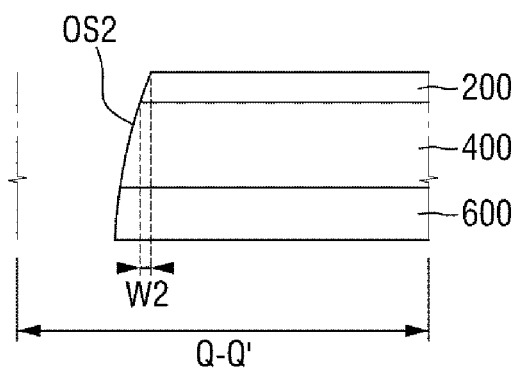

FIGS. 8A and 8B are cross-sectional views of a display device according to another exemplary embodiment. Hereinafter, the duplicated description of the exemplary embodiments described above will be omitted and differences will be mainly described.

Referring to FIG. 8A and FIG. 8B, an outer side OS2 (see a cut section of P-P') of a linear portion SA of a display device 2 may be different from an outer side OS2 (see a cut section of Q-Q') of a curved portion CA. and the shape of the outer side OS2 may be different from the exemplary embodiment described with reference to FIGS. 6A and 6B described above.

A width W1 of a region of the upper surface of the first substrate 200, which does not overlap with the lower surface in the linear portion SA may be greater than a width W2 of a region of the upper surface of the first substrate 200, which does not overlap with the lower surface in the curved portion CA. According to the shape of the outer surface OS2, an edge portion of the outer surface OS2 of the curved portion CA of the display device 2 may be not sharp but blunt. Such a shape of the outer surface OS2 of the curved portion CA allows the curved portion CA to withstand the external impact better. Thus, the reliability of the display device 2 may be improved.

Figure 9:
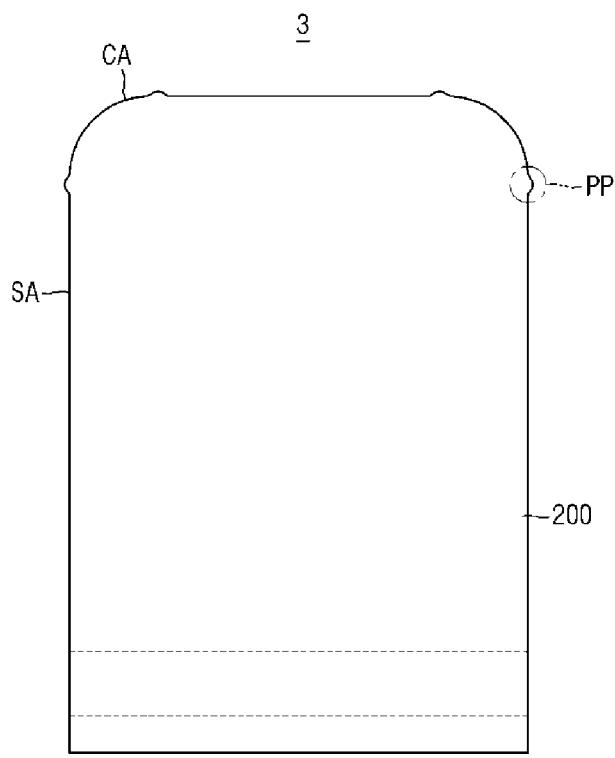
FIG. 9 is a rear view of a display device according to another exemplary embodiment.

FIG. 9 is a rear view of a display device according to still other exemplary embodiments. Hereinafter, the duplicated description of the exemplary embodiments described above will be omitted and differences will be mainly described.

Referring to FIG. 9, a display device 3 may include a deformed portion PP formed at a point where the linear portion SA and the curved portion CA meet. Specifically, the deformed portion PP may be formed on the outer surface where the linear portion SA and the curved portion CA are in contact with each other.

Such a deformed portion PP may be formed in such a manner that when the display device 3 is manufactured, processing conditions for processing the linear portion SA and processing conditions for processing the curved portion CA are different from each other. Although the deformed portion PP is largely shown to be emphasized for ease of understanding in the drawing, the actual size of the deformed portion PP may be small enough not to be visually checked. In some exemplary embodiments, the shape of the deformed portion PP may include protrusions that protrude from the surface of the outer surface as shown in the drawing.

Figure 10:
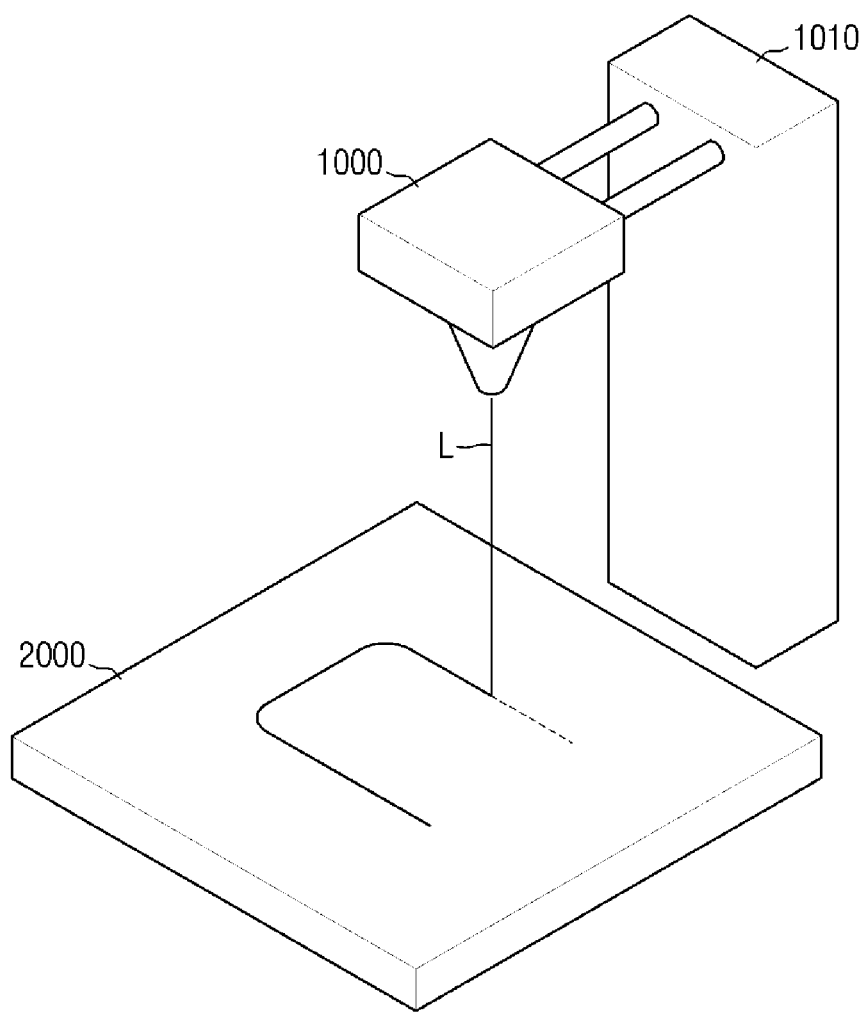
FIG. 10 is a schematic diagram of a laser processing apparatus according to an exemplary embodiment.

FIG. 10 is a schematic diagram of a laser processing apparatus according to another exemplary embodiment of the present invention.

Referring to FIG. 10, a laser processing apparatus may include an irradiation unit 1000 and a controller 1010.

The irradiation unit 1000 may apply laser light L onto an object 2000 to be processed. Specifically, the irradiation unit 1000 may cut the object 2000 to be processed into a desired shape by applying the laser light L onto the object 2000 to be processed.

In some exemplary embodiments, the object 2000 to be processed may include the first substrate 200, the display panel 400, and the second substrate 600, as shown in FIG. 1. That is, the laser processing apparatus shown in FIG. 10 may be an apparatus of cutting the object 2000 to be processed including the first substrate 200, the display panel 400, and the second substrate 600 to have the linear portion SA (see FIG. 2) and the curved portion CA (see FIG. 2).

The controller 1010 may control an operation of the irradiation unit 1000. Specifically, the controller 1010 may control a power level of the laser light L applied by the irradiation unit 1000, a moving speed of the laser light L applied by the irradiation unit 1000, and the number of times the laser light L is applied. Here, the moving speed of the laser light L may be a speed at which the irradiation unit 1000 moves while applying the laser light L onto the object 2000 to be processed, but the inventive concepts are not limited thereto. In another exemplary embodiment, the moving speed of the laser light L may be a speed at which the object 2000 to be processed is moved by applying the laser light L onto the object 2000 to be processed in a state where the irradiation unit 1000 is stopped.

Hereinafter, a method for manufacturing a display device will be described with reference to FIGS. 11 to 13. The method for manufacturing the display device to be described below may be performed using, for example, the laser processing apparatus described in FIG. 10, but the inventive concepts are not limited thereto.

Figure 11:
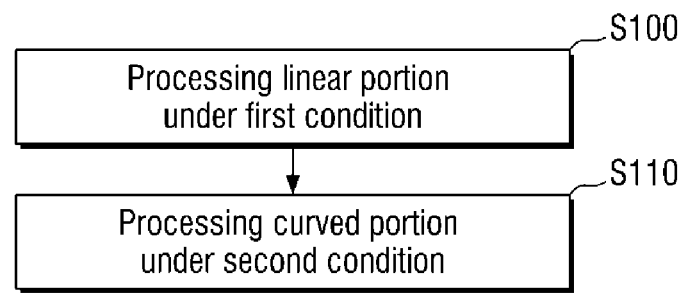
FIG. 11 is a flowchart for describing a method for manufacturing a display device according to an exemplary embodiment.

FIG. 11 is a flowchart for describing a method for manufacturing a display device according to an exemplary embodiment of the present invention. FIGS. 12 and 13 are views for describing a method for manufacturing a display device according to this exemplary embodiment of the present invention.

First, referring to FIG. 11, an object to be processed is provided. Then, the linear portion of the object to be processed is processed under the first condition (S100).

Figure 12:
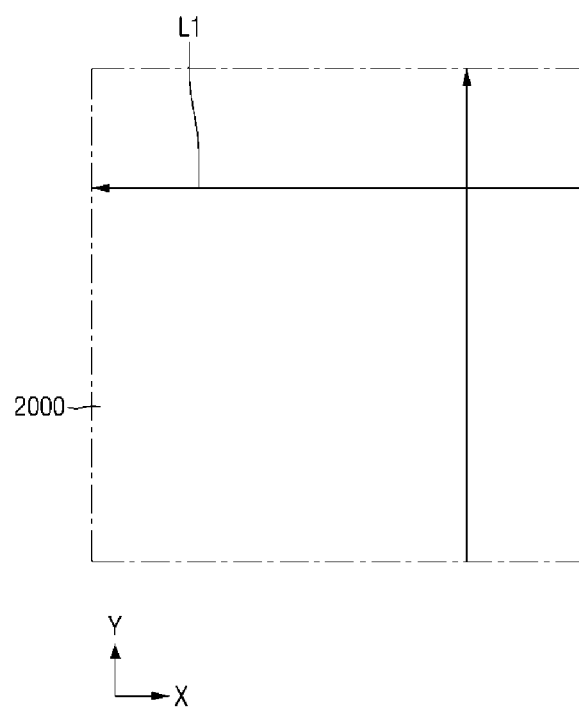
FIG. 12 and FIG. 13 are views for describing a method for manufacturing a display device according to an exemplary embodiment.

Specifically, referring to FIG. 12, it is possible to perform a first laser processing of forming the linear portion in the object 2000 to be processed by applying the first laser light L1 onto the object to be processed 2000. Here, the first laser processing may include applying a first laser light L1 having high energy onto the object 2000 to be processed repeatedly n times (where n is a natural number) by moving the first laser light L1 at a relatively low speed to the object 2000 to be processed. Here, the applying of the first laser light L1 repeatedly n times may include applying the first laser light L1 repeatedly n times along a contour of the shape of the linear portion shown in FIG. 12. Exemplary values for the first condition are described in Table 1 below.

TABLE 1

| Items | First condition - linear portion | Second condition - curved portion |
| --- | --- | --- |
| Laser power level | 18 to 26 W | 8 to 12 W |
| Moving speed | 220 to 250 mm/s | 5,000 to 7,000 mm/s |
| Scan times | 2 to 6 times | 120 to 160 times |

Referring back to FIG. 11, the curved portion of the object to be processed is processed under the second condition (S110).

Figure 13:
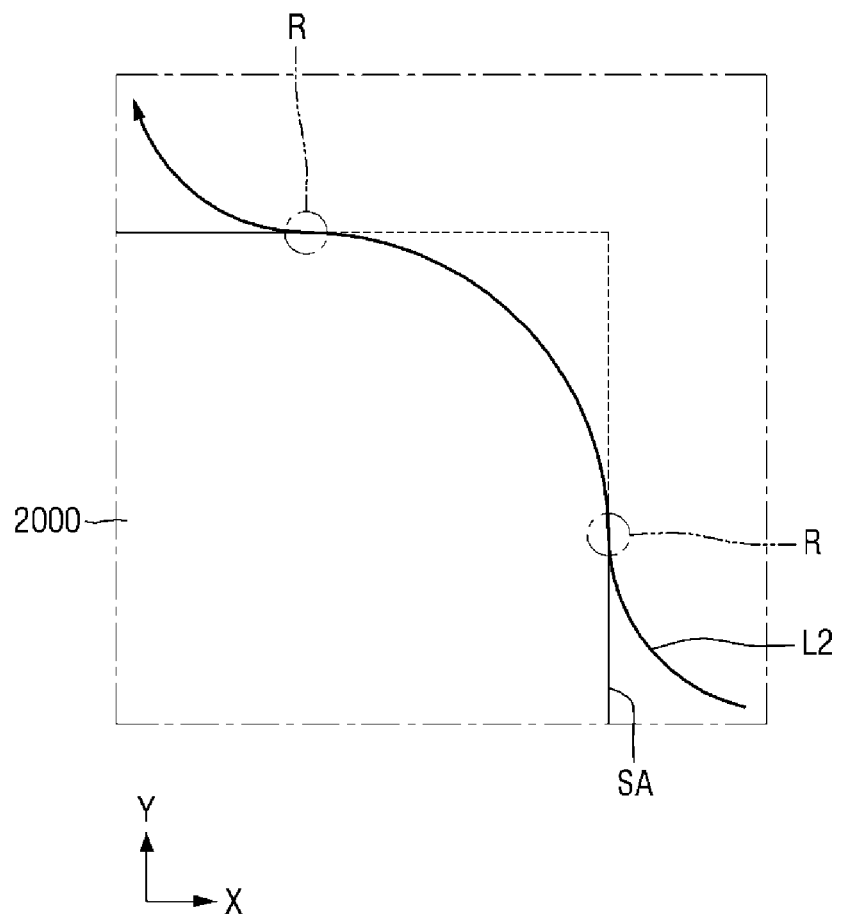

Specifically, referring to FIG. 13, it is possible to perform a second laser processing of forming the curved portion in the object 2000 to be processed by applying the first laser light L2 onto the object to be processed 2000. Here, the second laser processing may include, for example, applying a second laser light L2 having low energy onto the object 2000 to be processed repetitively m times (where m is a natural number) by moving the second laser light L2 at a relatively high speed to the object 2000 to be processed in which the processing of the linear portion SA is completed. Similarly, the irradiation of the second laser light L2 repeatedly m times may include applying the second laser light L2 repeatedly m times along a contour of the shape of the curved portion shown in FIG. 13. Exemplary values for the second condition are also described in Table 1 above.

In an exemplary embodiment, the deformed portions DPs (see FIGS. 2 and 3) may be formed in a region R where the first laser processing and the second laser processing proceed simultaneously. These deformed portions DPs (see FIGS. 2 and 3) may include depressions formed in the surface.

Figure 14:
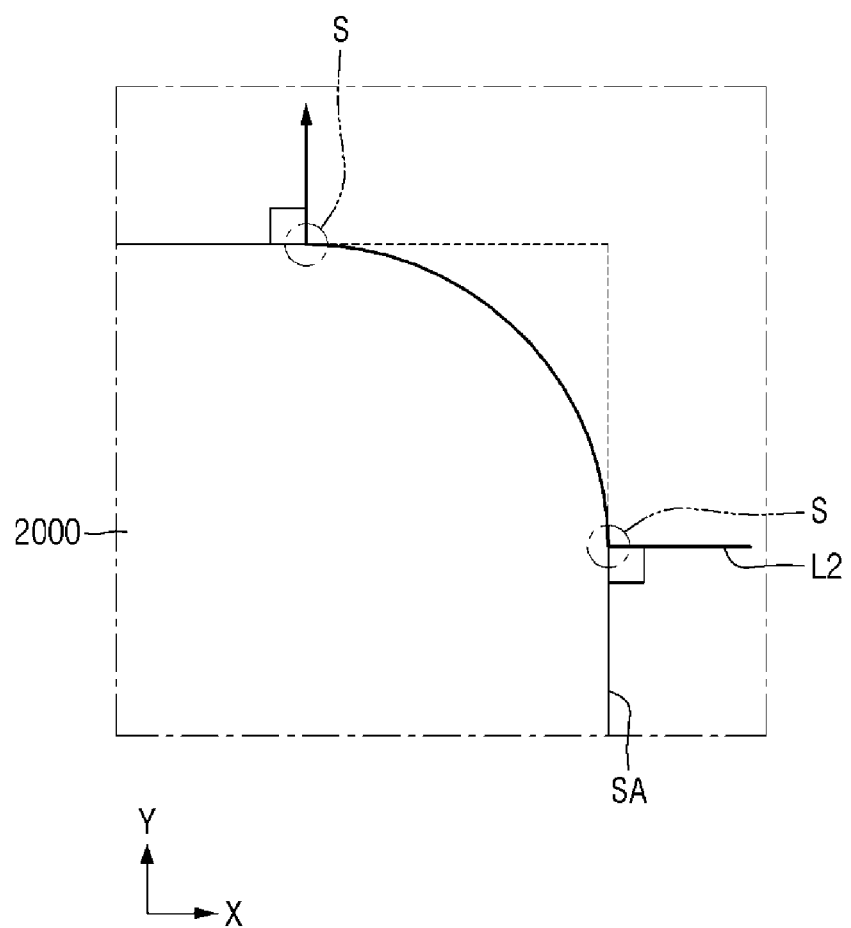
FIG. 14 is a view for describing a method for manufacturing a display device according to an exemplary embodiment.

FIG. 14 is a view for describing a method for manufacturing a display device according to an exemplary embodiment of the present invention. Hereinafter, the duplicated description of the exemplary embodiments described above will be omitted and differences will be mainly described.

Referring to FIG. 14, the method for manufacturing the display device according to this exemplary embodiment is different from the above-described exemplary embodiment in the second laser processing method for processing the curved portion. Specifically, in the exemplary embodiment described with reference to FIG. 13 above, the second laser light L2 is applied with a contour that forms an acute angle with the linear portion SA that has been processed, but in the present exemplary embodiment, as shown in FIG. 14 the second laser light L2 may be applied with a contour that forms a substantially right angle to the linear portion SA that has been processed. Accordingly, the shape of the deformed portion formed in a region S in which the first laser processing and the second laser processing proceed simultaneously may be different from the embodiment described above. Specifically, the deformed portion PP (see FIG. 9) described above may be formed in the region S in which the first laser processing and the second laser processing proceed simultaneously. Such a deformed portion PP (see FIG. 9) may include a protrusion protruding from the surface.

According to the display device and the method for manufacturing the display device according to the exemplary embodiments, it is possible to allow the curved portion to sufficiently withstand external impacts by improving a shape of an edge portion of an outer side of the curved portion of the display device. Therefore, it is possible to improve reliability of the display device.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method for manufacturing a display device, comprising:
    providing an object to be processed;
    forming a linear portion of the object to be processed by performing a first laser processing for the object to be processed; and
    forming a curved portion of the object to be processed by performing a second laser processing different from the first laser processing for the object to be processed.

2. The method for manufacturing a display device of claim 1, wherein the object to be processed comprises first and second substrates and a display panel disposed between the first and second substrates.

3. The method for manufacturing a display device of claim 1, wherein the first laser processing comprises applying a laser having a first power level onto the object to be processed by moving at a first speed, and the second laser processing comprises applying a laser having a second power level different from the first power level onto the object to be processed by moving at a second speed different from the first speed.

4. The method for manufacturing a display device of claim 3, wherein the first power level is greater than the second power level and the first speed is less than the second speed.

5. The method for manufacturing a display device of claim 3, further comprising: repeating the first laser processing n times (n is a natural number) and repeating the second laser processing m times (m is a natural number different from n).

6. The method for manufacturing a display device of claim 5, wherein n is less than m.

* * * * *